(12) United States Patent
Huang et al.

(10) Patent No.: US 9,558,927 B2
(45) Date of Patent: Jan. 31, 2017

(54) WET CLEANING METHOD FOR CLEANING SMALL PITCH FEATURES

(71) Applicant: Taiwan Semiconductor Manufacturing Company, Ltd., Hsin-Chu (TW)

(72) Inventors: Chien-Hua Huang, Toufen Township (TW); Tsung-Min Huang, Taichung (TW); Chung-Ju Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 13/942,072

(22) Filed: Jul. 15, 2013

(65) Prior Publication Data

US 2014/0273454 A1  Sep. 18, 2014

Related U.S. Application Data

(60) Provisional application No. 61/784,022, filed on Mar. 14, 2013.

(51) Int. Cl.
*H01L 21/02* (2006.01)
*H01L 21/67* (2006.01)
*H01L 21/306* (2006.01)

(52) U.S. Cl.
CPC ... *H01L 21/02063* (2013.01); *H01L 21/67051* (2013.01)

(58) Field of Classification Search
CPC ......... C11D 3/06; C11D 7/16; C11D 11/0047; C11D 11/007; B08B 3/04; H01L 21/02057; H01L 21/02087; H01L 21/67051; H01L 21/0263; G03F 1/82
See application file for complete search history.

(56) References Cited

U.S. PATENT DOCUMENTS

| | | | |
|---|---|---|---|
| 5,967,156 A * | 10/1999 | Rose ................ | B08B 7/0092 134/7 |
| 2002/0170586 A1* | 11/2002 | Lee et al. ................ | 134/146 |
| 2005/0081998 A1* | 4/2005 | Hampden-Smith et al. ................ | 156/345.12 |
| 2007/0087949 A1* | 4/2007 | Wu et al. ................ | 510/175 |
| 2008/0011330 A1* | 1/2008 | Kruwinus ................ | 134/31 |
| 2008/0196742 A1* | 8/2008 | Beck ................ | 134/1.3 |
| 2009/0001198 A1* | 1/2009 | Norimatsu ................ | 239/654 |
| 2009/0056746 A1* | 3/2009 | Sandhu et al. ................ | 134/3 |
| 2009/0065026 A1* | 3/2009 | Kiehlbauch et al. ......... | 134/1.2 |
| 2009/0078282 A1* | 3/2009 | de Larios et al. ................ | 134/6 |
| 2009/0114246 A1* | 5/2009 | Sinha et al. ................ | 134/1.3 |
| 2010/0055924 A1* | 3/2010 | Ganesan et al. ............ | 438/748 |
| 2010/0224215 A1* | 9/2010 | Mertens et al. ................ | 134/6 |
| 2010/0319733 A1* | 12/2010 | Rebstock ................ | 134/21 |
| 2011/0206593 A1* | 8/2011 | Fahs, II ................ | C02F 1/32 423/351 |
| 2014/0004256 A1* | 1/2014 | Sinha ................ | 427/123 |

(Continued)

*Primary Examiner* — Alexander Markoff
(74) *Attorney, Agent, or Firm* — Slater Matsil, LLP

(57) ABSTRACT

A method for reducing contaminants in a semiconductor device is provided. The method includes cleaning the semiconductor substrate. The cleaning includes rotating the semiconductor substrate and dispersing an aerosol at a predetermined temperature to a surface of the semiconductor substrate or a layer formed on the substrate to be cleaned. The aerosol includes a chemical having a predetermined pressure and a gas having a predetermined flow rate.

20 Claims, 3 Drawing Sheets

(56) References Cited

U.S. PATENT DOCUMENTS

2014/0069467 A1* 3/2014 Rebstock ................. 134/32
2014/0190529 A1* 7/2014 Ganesan et al. ............ 134/95.1
2014/0273454 A1* 9/2014 Huang et al. ................ 438/689

* cited by examiner

WET CLEANING METHOD FOR CLEANING SMALL PITCH FEATURES

RELATED CASES

This application claims priority to U.S. Provisional Patent Application No. 61/784,022, filed Mar. 14, 2013, which application is incorporated herein by reference.

BACKGROUND

Processing wafers to manufacture semiconductor devices includes several steps such as etching and cleaning processes to form features of the semiconductor device on the wafers. The etching processes involve removal of material either directly from the wafers or from layers formed on the wafers. The etching processes leave behind residual material which is removed during the cleaning processes. However, as the geometry of semiconductor devices continues to decrease, trace amounts of contaminants, such as polymer residues remaining behind in high aspect ratio trenches and vias are becoming more and more difficult to remove.

Conventional cleaning methods use wet spray and dispense methods in which the semiconductor substrate is rotated at a relatively high spin speed (e.g., 300-1000 rpm) and high spray force (e.g., pressures up to 30 psi) is used to produce strong shear stress and turbulent flow for cleaning the sidewalls and bottoms of high aspect ratio trenches and vias. These cleaning methods, however come not without their shortcomings. Feature patterns with small pitch (e.g., less than 40 nm) can be easily collapsed by the strong shear force and the high wafer rotation. Further, the efficiency of removing residue at the bottoms and/or on the sidewall of high aspect ratio trenches and vias is very low. Furthermore, these traditional cleaning methods can be expensive in that they use high chemical consumption (e.g., about 0.5-4 L/min.).

Accordingly, a need exists for an improved cleaning method for cleaning small pitch features that do not have the shortcomings of traditional cleaning methods.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
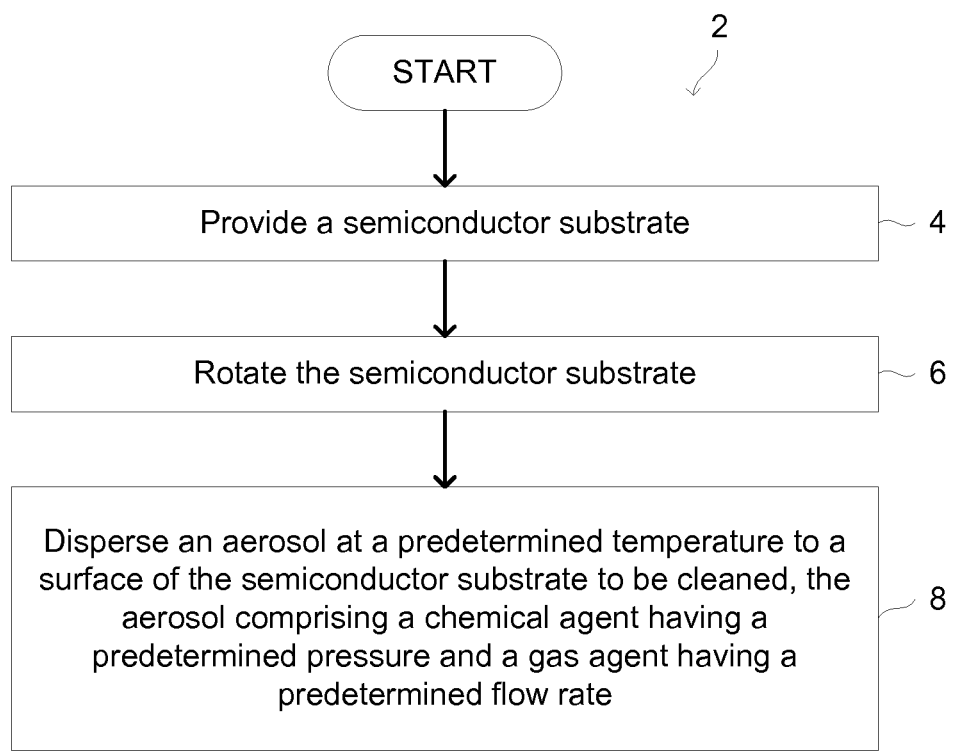
FIG. 1 is a flowchart of a method of cleaning a semiconductor substrate according to various embodiments of the present disclosure.

Embodiments of the wafer cleaning method of the present disclosure may be used at various stages during the formation of semiconductor devices on a semiconductor substrate. FIG. 1 is a flowchart of a method 2 for cleaning and/or removing unwanted residue from a semiconductor substrate, alternatively referred to as a "wafer", according to various aspects of the present disclosure. Referring to FIG. 1, the method 2 includes block 4, in which a semiconductor substrate is provided. The method 2 includes block 6, in which the semiconductor substrate is rotated. The method 2 includes block 8, in which an aerosol is dispersed at a predetermined temperature to a surface of the semiconductor substrate or on a layer formed on the substrate to be cleaned. The aerosol includes a chemical agent and a gas agent. The chemical agent has a predetermined pressure and the gas agent has a predetermined flow rate.

It is understood that additional processes may be performed before, during, or after the blocks 4-8 shown in FIG. 1 to accomplish the cleaning of the semiconductor substrate or the removal of unwanted residue from the semiconductor substrate, but these additional processes are not discussed herein in detail for the sake of simplicity. For example, prior to the cleaning process of method 2, the semiconductor substrate may undergo an etching process. The etching process forms features such as lines, trenches, vias, contacts or other suitable features in the wafer or layers formed on the wafer that may leave unwanted residue, particle, or polymer in these features.

Figure 2:
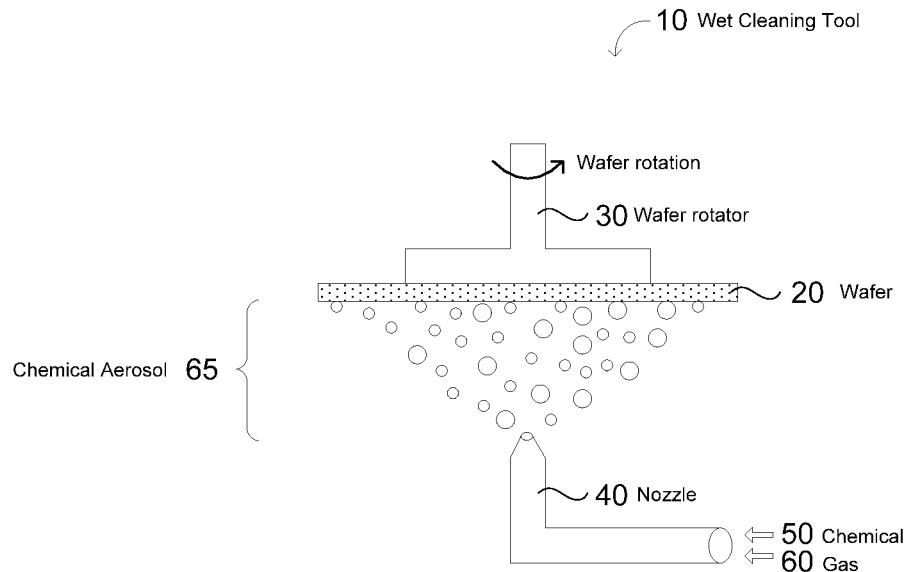
FIG. 2 is a cross-sectional view of a portion of a cleaning apparatus illustrating a method of cleaning a semiconductor substrate according to one embodiment of the present disclosure.
Figure 3:
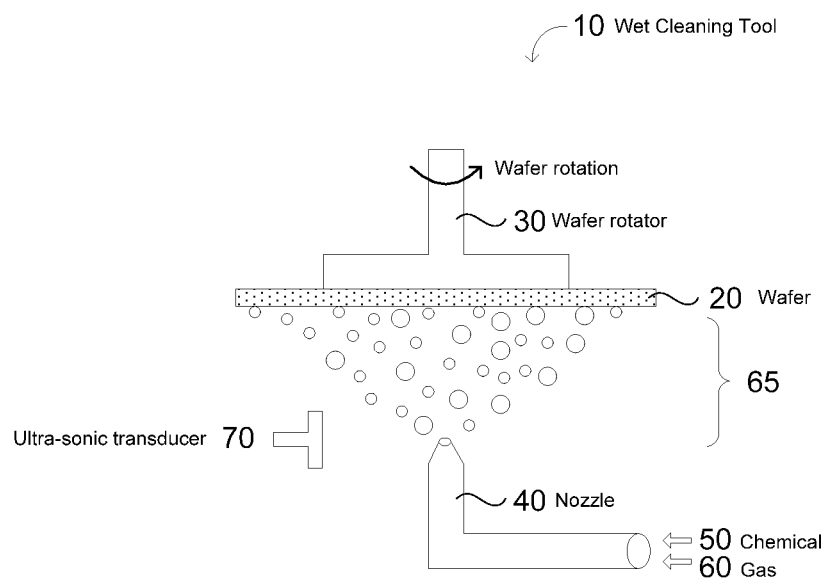
FIG. 3 is a cross-sectional view of a portion of a cleaning apparatus illustrating a method of cleaning a semiconductor substrate according to another embodiment of the present disclosure.
Figure 4:
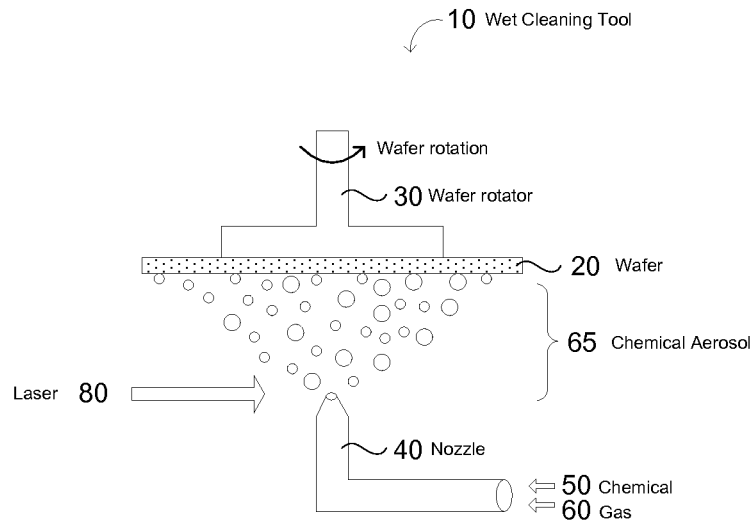
FIG. 4 is a cross-sectional view of a portion of a cleaning apparatus illustrating a method of cleaning a semiconductor substrate according to yet another embodiment of the present disclosure.

FIGS. 2-4 are cross-sectional side views of portions of a cleaning apparatus, according to embodiments of the method 2 of FIG. 1. It is understood that FIGS. 2-4 have been oversimplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

The wet cleaning method of the present disclosure includes an aerosol operation and may include one or more wet cleaning operations prior to the aerosol cleaning operation and one or more cleaning, rinsing, and/or drying operations after the aerosol cleaning operation. The various sequences of aerosol and/or wet cleaning operations may be performed in-situ and/or in various wet cleaning tools such as DV-Prime®, Da Vinci®, and SP Series manufactured by Lam Research Corporation; Cellesta-i® manufactured by Tokyo Electron, Ltd.; and SU-3100 and SU-3200 manufactured by Dainippan Screen. Depending on the type of cleaning tool used, individual wafers may be rotated and cleaned or they may be rotated and cleaned in batch in a single-wafer processing chamber.

Referring now to FIG. 2, a cross-sectional view of a portion of a wet cleaning tool 10 is illustrated in which a semiconductor wafer 20 to be cleaned is affixed onto a wafer rotation device or wafer rotator 30, according to one embodiment of the present disclosure. FIG. 2 shows wafer 20 facing down for wet cleaning. In some embodiments, however wafer 20 may face up or in any other direction for cleaning.

With the wafer rotator 30 rotating the wafer 20 at a speed of less than about 500 revolutions per minute (rpm), an aerosol or chemical aerosol 65 is dispersed through nozzle 40 to a surface of wafer 20 to be cleaned. Chemical aerosol 65 includes a chemical or chemical agent 50 for chemically removing unwanted particle, residue, polymer, or the like as well as a gas or gas agent 60. Nozzle 40 is configured to supply gas agent 60 stored in a gas supply container (not shown) and to supply chemical agent 50 stored in a chemical supply container (not shown) via a controller (also not shown) that regulates the flow of gas 60 and/or chemical 50. Nozzle 40 may have one or more outlets and the outlet may have either a slot or a circular shape. The details of the gas supply container, chemical supply container, and the controller are not discussed for the sake of brevity.

Figure 5:
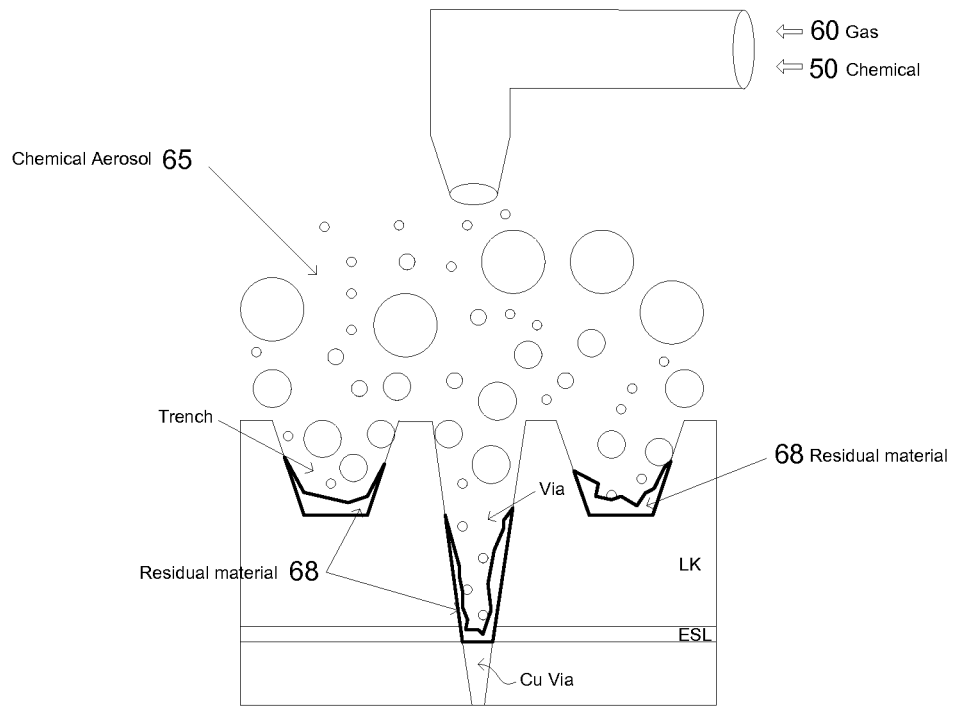
FIG. 5 is a cross-sectional view of an exploded section of a semiconductor wafer illustrating a process of wet cleaning, according to embodiments of the present disclosure.

Chemical agent 50 is sealed in the chemical supply container under pressure with gas 60 serving as the activating agent or propellant and released as a spray or foam through nozzle 40. FIG. 5 is a cross-sectional view of an exploded section of semiconductor wafer 20 illustrating a process of wet cleaning, according to embodiments of the present disclosure. The etching process leaves residual material 68 that may be left in a feature etched in a layer of the wafer 20, such as a trench or via. The residual material 68 includes unreacted etchant, etching by-products, particles of the etched material or other material such as, for example polymers. The residual material 68 is potentially damaging to the wafer 20 by either increasing the size of the features etched into the wafer or creating additional unintended features in the wafer 20. The etched wafers are subjected to the chemical aerosol cleaning process to remove the residual material.

According to an exemplary embodiment of the present disclosure, the wafer 20 is rotated at a speed of less than about 500 rpm and the chemical aerosol 65 is dispersed at the wafer 20 at a temperature of less than about 60 C with the gas 60 being dispersed at a flow rate of less than about 20 liter/minute and the chemical 50 being dispersed at a pressure of less than about 40 psi. In other embodiments, the flow rate of gas 60 can be about 10 liter/minute. The pressure of the chemical 50 can be about 20 psi. The aerosol cleaning process lasts for a duration of about 1 minute. In some embodiments, the duration of the aerosol cleaning process is more or less than 1 minute depending on the time needed to sufficiently clean the wafer. If the duration of the aerosol cleaning process is too short, the wafer 20 will not be sufficiently cleaned and the residual materials 68 can still cause damage to the wafer. If the duration of the aerosol cleaning process is too long, the production yield is decreased based on reduced throughput. One of ordinary skill in the art is able to modify the flow rate, pressure, wafer rotation, time, and temperature based on the particular material needed to be removed from the wafer 20.

Returning back to FIG. 2, the gas agent 60 is an inert gas. An inert gas in a low oxygen environment can help protect an exposed metal layer, such as a copper or tungsten via from oxidizing. The inert gas can include nitrogen (N2), noble gas, and/or combinations thereof. In some embodiments, the inert gas is argon (Ar), CO2, neon (Ne) or other suitable inert gases. In some embodiments, the gas agent 60 is an oxidative gas and may include O2, O3, and other suitable oxidative gases. The oxidative gas improves oxidation capability for the removal of polymer residues or metal-rich residues. In still some embodiments, the gas agent 60 is a reductive gas and may include H2/N2 or some other suitable reductive gases. The gas agent 60 can also be a combination of inert, oxidative, and reductive gases.

The chemical agent 50 can be polyethylene-polypropylene glycol, glycolether compound, modified oxirane polymer, methyl, organosulfur compound, methylimidazole, aminoethanol, aminopropanol, hydroxyamine, tetramethylammonium hydroxide, or a combination of these.

In some embodiments as illustrated in FIG. 3, the aerosol cleaning method can be performed in an ultra-sonic vibration system where an ultra-sonic transducer 70 is used in conjunction with the chemical aerosol 65 to assist the aerosol 65 in the removal of unwanted residual material. Ultra-sonic transducers produce sound waves in frequencies above audio frequencies. They are well-known in the art and the details of such will not be discussed for the sake of brevity. When aerosol comes into contact with sound waves produced by the ultra-sonic transducer 70, the ultra-sonic assisted aerosol is smaller and tighter (e.g., less than 1 µm) than aerosol alone. The ultra-sonic assisted aerosol can better permeate into small pitch high aspect ratio features for improved cleaning performance.

In another embodiment shown in FIG. 4, the aerosol cleaning method can be performed in a laser system or a pulse laser irradiation system where a laser 80 is used in conjunction with the chemical aerosol 65 to assist the chemical aerosol 65 in the removal of unwanted residual material. Laser systems are well-known in the art and the details of such will not therefore be discussed. By employing laser 80 at or near nozzle 40, when aerosol comes into contact with beams from laser 80, the laser assisted energetic aerosol that are produced are smaller and tighter than aerosol alone. The laser assisted aerosol can better penetrate into small pitch high aspect ratio features for improved cleaning.

In yet other embodiments, the aerosol cleaning method can be performed in an ultra-sonic vibration system where an electrical pulse electrode is used in conjunction with the chemical aerosol 65 to assist the aerosol 65 in the removal of unwanted residual material. The electrical pulse electrode generates an electrical pulse that helps in the breakdown of the aerosol 65, so aerosol sizes can be further reduced in order to penetrate further into small pitch high aspect ratio features for improved cleaning. Electrical pulse electrodes are well known in the art and can include plate, coil, matrix, and antenna type pulses.

After wafer 20 is cleaned the wafer 20 is transferred to another device for further processing, such as a drying operation. Although embodiments of the aerosol cleaning method of the present disclosure is particularly useful in post-etch cleaning, it may find application for any cleaning operation at various stages during the manufacture of semiconductor substrates such as post-CMP cleaning or front-end of line cleaning.

Advantages of one or more embodiments of the present disclosure may include one or more of the following.

In one or more embodiments, feature patterns with small pitch (e.g., less than 40 nm) are not easily collapsed because wet cleaning using chemical aerosol does not require strong shear force and high wafer rotation.

In one or more embodiments, residual matter at the bottoms and/or sidewalls of high aspect ratio trenches and vias can easily be removed.

In one or more embodiments, chemical consumption (e.g., 15-20 mL/min.) used in aerosol cleaning is low compared to traditional wet cleaning methods, thus saving costs.

The present disclosure has described various exemplary embodiments. According to one embodiment, a method for reducing contaminants in a semiconductor device is provided. The method includes cleaning the semiconductor substrate. The cleaning includes rotating the semiconductor substrate and dispersing an aerosol at a predetermined temperature to a surface of the semiconductor substrate or a layer formed on the substrate to be cleaned. The aerosol includes a chemical having a predetermined pressure and a gas having a predetermined flow rate.

According to another embodiment, a method for reducing contaminants in a semiconductor device is provided. The method includes providing a semiconductor substrate and cleaning the semiconductor substrate. The cleaning includes rotating the semiconductor substrate and dispersing an aerosol at a predetermined temperature to a surface of the semiconductor substrate or to a layer formed on the semiconductor substrate to be cleaned. The aerosol includes a chemical agent having a predetermined pressure and a gas agent having a predetermined flow rate.

According to yet another embodiment, a wafer cleaning system configured to perform a wet cleaning process on a semiconductor wafer is provided. The wafer cleaning system includes a cleaning chamber, rotating means for rotating the semiconductor wafer, and an aerosol comprising a chemical agent and a gas agent. The wafer cleaning system further includes dispersing means for dispersing the chemical agent and the gas agent into the cleaning chamber at a surface of the semiconductor wafer or a layer formed on the wafer to be cleaned. The wafer cleaning system further includes controlling means for controlling the flow rate of the chemical agent and the gas agent into the cleaning chamber.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of cleaning a semiconductor substrate, the method comprising:
   providing a semiconductor substrate, the semiconductor substrate having a major surface;
   rotating the semiconductor substrate; and
   dispersing an aerosol from a nozzle at a predetermined temperature to a surface of the semiconductor substrate to be cleaned, the aerosol having a first aerosol size, the aerosol comprising:
      a chemical agent having a predetermined pressure; and
      a gas agent having a predetermined flow rate; and
   providing a laser beam or pulse laser irradiation beam impinging upon the aerosol at or near the nozzle to produce a laser assisted energetic aerosol formed by the laser beam or pulse laser irradiation beam prior to the aerosol coming into contact with the surface of the semiconductor substrate, the laser assisted energetic aerosol having a second aerosol size, the second aerosol size smaller than the first aerosol size, the laser beam or pulse laser irradiation beam incident to the aerosol in a direction substantially parallel to the major surface of the semiconductor substrate.

2. The method of claim 1, wherein the semiconductor substrate is rotated at a speed of less than about 500 rpm.

3. The method of claim 1, wherein the aerosol is dispersed at a temperature of less than about 60 C.

4. The method of claim 1, wherein the chemical agent has a predetermined pressure of less than about 40 psi.

5. The method of claim 1, wherein the gas agent has a predetermined flow rate of less than about 20 liter/minute.

6. The method of claim 1, wherein the gas agent comprises an inert gas, an oxidative gas, reductive gas, or a combination of these.

7. The method of claim 6, wherein the gas agent is nitrogen (N2), argon (Ar), neon (Ne), CO2, O2, O3, H2/N2, or combinations thereof.

8. The method of claim 1, wherein the chemical agent is polyethylene-polypropylene glycol, glycolether compound, modified oxirane polymer, organosulfur compound, methylimidazole, aminoethanol, aminopropanol, hydroxyamine, tetramethylammonium hydroxide, or combinations thereof.

9. The method of claim 1, further comprising:
   generating an ultrasonic vibration to assist in the dispersion of the aerosol.

10. A method for reducing contaminants in a semiconductor device, the method comprising:
    providing a semiconductor substrate; and
    cleaning the semiconductor substrate, wherein the cleaning comprises:
       rotating the semiconductor substrate; and
       dispersing an aerosol from an orifice at a predetermined temperature to a surface of the semiconductor substrate or to a layer formed on the semiconductor substrate to be cleaned prior to the aerosol coming into contact with the surface of the semiconductor substrate or with the layer formed on the semiconductor substrate, the aerosol having an aerosol size, the aerosol comprising:
          a chemical agent having a predetermined pressure; and
          a gas agent having a predetermined flow rate; and
       irradiating the aerosol with a laser at or near the orifice to reduce the aerosol size of the aerosol, wherein the aerosol is impinged upon by the laser from a first direction, the first direction substantially orthogonal to a second direction normal to the surface of the semiconductor substrate.

11. The method of claim 10, wherein the semiconductor substrate comprises at least one of a trench, via, or contact.

12. The method of claim 10, wherein the cleaning comprises individually cleaning the semiconductor substrate in a tool that processes semiconductor substrates individually.

13. The method of claim 10, wherein the gas agent comprises an inert gas, an oxidative gas, reductive gas, or a combination of these, and further wherein the gas agent is nitrogen (N2), argon (Ar), neon (Ne), CO2, O2, O3, H2/N2, or combinations thereof.

14. The method of claim 10, wherein the chemical agent is polyethylene-polypropylene glycol, glycolether compound, modified oxirane polymer, organosulfur compound, methylimidazole, aminoethanol, aminopropanol, hydroxyamine, tetramethylammonium hydroxide, or combinations thereof.

15. The method of claim 10, further comprising etching a feature on the semiconductor substrate prior to the step of cleaning the semiconductor substrate.

16. A method comprising:
performing an operation on a substrate, the substrate having a major surface, the operation leaving a residual material;
spinning the substrate; and
removing the residual material by dispensing, at a predetermined temperature, a chemical aerosol from an aerosol outlet onto the substrate, the chemical aerosol including a chemical agent and a gas agent, while providing a laser beam or pulse laser irradiation beam to impinge upon the chemical aerosol at or near the aerosol outlet, the laser beam or pulse laser irradiation beam reducing an aerosol size of the chemical aerosol prior to the chemical aerosol coming into contact with the substrate, the laser beam or pulse laser irradiation beam incident to the chemical aerosol in a direction substantially orthogonal to a normal vector of the major surface of the substrate.

17. The method of claim 16, wherein the chemical agent is polyethylene-polypropylene glycol, glycolether compound, modified oxirane polymer, organosulfur compound, methylimidazole, aminoethanol, aminopropanol, hydroxyamine, tetramethylammonium hydroxide, or combinations thereof.

18. The method of claim 16, wherein the chemical agent is dispensed at a pressure of less than about 40 psi.

19. The method of claim 16, wherein the gas agent is dispensed at a flow rate of less than about 20 liter/minute.

20. The method of claim 16, further comprising etching a feature on the substrate prior to removing the residual material.

* * * * *